United States Patent [19]

Murayama et al.

[11] Patent Number: 5,122,649
[45] Date of Patent: Jun. 16, 1992

[54] SOLID-STATE IMAGING DEVICE HAVING A PREDETERMINED IMPURITY LAYER EMBEDDED BETWEEN TWO ADJACENT SETS OF SWITCHING TRANSISTOR

[75] Inventors: Jin Murayama; Jun Fukazawa, both of Kanagawa, Japan

[73] Assignee: Fuji Photo Film Co., Ltd., Kanagawa, Japan

[21] Appl. No.: 622,575

[22] Filed: Dec. 5, 1990

[30] Foreign Application Priority Data

Dec. 11, 1989 [JP] Japan .................................. 1-318962

[51] Int. Cl.⁵ ............................................ H01J 40/14
[52] U.S. Cl. .................................... 250/208.1; 357/30; 358/213.15
[58] Field of Search ............................ 250/208.1, 211 J; 357/30 H, 30 D, 31, 32; 358/213.15, 213.26, 213.28, 213.29, 482, 483

[56] References Cited

U.S. PATENT DOCUMENTS

| 4,223,330 | 9/1980 | Koike et al. | 357/31 |
| 4,743,955 | 5/1988 | Matsumoto | 357/30 |
| 4,857,751 | 8/1989 | Hatanaka et al. | 250/208.1 |
| 4,910,568 | 3/1990 | Takei et al. | 357/30 |

Primary Examiner—David C. Nelms
Assistant Examiner—Que T. Le
Attorney, Agent, or Firm—Sughrue, Mion, Zinn, Macpeak & Seas

[57] ABSTRACT

A MOS-type solid-state imaging device is disclosed capable of high speed scanning. The imaging device includes a plurality of photodiodes arranged in a matrix form, a vertical scanning circuit, a horizontal scanning circuit, a first group of switching transistors and a second switching transistors. The imaging device enables multiple pixel signals to be simultaneously outputted without adversely effecting adjacent pixel signals during a scanning operations. A separating layer formed of an impurity layer held at a predetermined potential is embedded at least between two adjacent switching transistors, thereby separating the capacitive coupling between the two adjacent sets of switching transistors.

11 Claims, 5 Drawing Sheets

P WELL LAYER

SOLID-STATE IMAGING DEVICE HAVING A PREDETERMINED IMPURITY LAYER EMBEDDED BETWEEN TWO ADJACENT SETS OF SWITCHING TRANSISTOR

BACKGROUND OF THE INVENTION

The present invention relates to a MOS-type solid-state imaging device and, more particularly, to a solid-state imaging device for imaging a plurality of frames at high speeds.

A conventional MOS-type solid-state imaging device has a structure as shown in FIG. 3. This solid-state imaging device, formed by a semiconductor fabricating process, includes a light receiving region 1, a vertical scanning circuit 2 and a horizontal scanning circuit 3 for reading pixel signals.

The light receiving region 1 will be described first. A plurality of $n^+$-type impurity regions are embedded in matrix form in a p-type well layer arranged on a surface portion of an n-type semiconductor substrate forming a plurality of photodiodes $P_{11}$, $P_{12}$, ..., $P_{21}$, $P_{22}$, ..., $P_{31}$, $P_{32}$, ..., as shown in FIG. 3. Signal read lines $S_1$, $S_2$, $S_3$, $S_4$, ... and vertical scanning lines $V_1$, $V_2$, $V_3$, ... extend vertically and horizontally, respectively, between these photodiodes. The vertical scanning lines $V_1$, $V_2$, $V_3$, ... are connected to predetermined bit output contacts $b_1$, $b_2$, $b_3$, ... of the vertical scanning circuit 2 which is formed of shift registers. The signal read lines $S_1$, $S_2$, $S_3$, $S_4$, ... are connected to an output terminal 4 through second switching transistors $M_1$, $M_2$, $M_3$, $M_4$, ... . The gate contacts of the second switching transistors $M_1$, $M_2$, $M_3$, $M_4$, ... are connected to predetermined bit output contacts $h_1$, $h_2$, $h_3$, $h_4$ ... of the horizontal scanning circuit 3, also formed of shift registers.

A first switching transistor is interposed between each photodiode and its corresponding signal read line, as exemplified by a switching transistor $C_1$ between the photodiode $P_{11}$ and the signal read line $S_1$. The gate contacts of these first switching transistors are connected to the vertical scanning lines $V_1$, $V_2$, $V_3$, ... extending from the vertical scanning circuit 2.

To form an image with the MOS-type solid-state imaging device thus constructed, an image is read by scanning at timings as shown in FIG. 4. That is, after receiving an optical image within a predetermined exposure period, a high-level signal $S_{V1}$ is applied from the first bit output contact $b_1$ of the vertical scanning circuit 2 for a predetermined period T, thereby turning on a group of switching transistors connected to the first vertical scanning line $V_1$. Therefore, the pixel signals corresponding to the photodiodes $P_{11}$, $P_{12}$, ... connected to the first vertical scanning line $V_1$ can be transmitted to the signal read lines $S_1$, $S_2$, $S_3$, $S_4$, .... In addition, within the same period T, a pulse signal $S_h$ is applied from the lower to higher bits of the horizontal scanning circuit 3 at a predetermined period $\tau$, causing the second switching transistors $M_1$, $M_2$, $M_3$, $M_4$, ... to conduct sequentially s that the pixel signal of each of the photodiodes $P_{11}$, $P_{12}$, ... will be outputted to the output terminal 4 as a periodic signal $S(\tau)$ every period $\tau$.

Then, a high level signal $S_{V2}$ is applied from the second bit output contact $b_2$ of the vertical scanning circuit 2 for the predetermined period T, thereby turning on a group of second switching transistors connected to the first vertical scanning line $V_2$. Therefore, the pixel signals corresponding to the photodiodes $P_{21}$, $P_{22}$, ... connected to the second vertical scanning line $V_2$ can be transmitted to the signal read lines $S_1$, $S_2$, $S_3$, $S_4$, .... In addition, within the same period T, the pulse signal $S_h$ is applied from the lower to higher bits of the horizontal scanning circuit 3 at the predetermined period $\tau$ causing the second switching transistors $M_1$, $M_2$, $M_3$, $M_4$, ... to conduct sequentially so that the pixel signal of each of the photodiodes $P_{21}$, $P_{22}$, ... will be outputted to the output terminal 4 as the signal $S(\tau)$ every period $\tau$.

By repeating the above-described vertical and horizontal scanning operations for the remaining photodiodes, pixel signals equivalent to a single frame are read as a signal $S(\tau)$.

The above MOS-type solid-state imaging device is adapted for reading pixel signals when a comparatively small number of pixels are scanned at a comparatively low speed. However, if a solid-state imaging device has a large number of pixels (photodiodes), and a large number of pixel signals must be read by the above vertical and horizontal scanning operations, then a very high speed horizontal scanning circuit is necessary, which is not technically feasible in the above imaging device.

To overcome this problem, the inventors of the present invention have researched and developed a solid-state imaging device that can horizontally scan simultaneously a set of plural pixels. This allows the solid-state imaging device to read an image at high speeds without requiring high speed horizontal scanning circuits.

A typical structure of such a solid-state imaging device will be described with reference to FIG. 5. In FIG. 5, reference numeral 2 designates a vertical scanning circuit consisting of shift registers, and reference number 3 designates a horizontal scanning circuit consisting of shift registers. Bit outputs $b_1$, $b_2$, ... $b_n$ of the vertical scanning circuit 2 are connected to vertical scanning lines $V_1$, $V_2$, ... $V_n$, respectively, while bit outputs $h_1$, $h_2$, ... $h_m$ of the horizontal scanning circuit 3 are connected to horizontal scanning lines $l_1$, $l_2$, ... $l_m$, respectively.

Further, a group of photodiodes, each of which forms a pixel, are connected, in a manner similar to that shown in FIG. 3, to predetermined signal read lines $S_1$, $S_2$, ... $S_{16m}$, respectively, through switching transistors. The switching transistors conduct or do not conduct in accordance with the voltage of each of the vertical scanning lines $V_1$, $V_2$, ... $V_n$, while predetermined switching transistors $M_{11}$–$M_{14}$, $M_{21}$–$M_{24}$, ..., $M_{4m1}$–$M_{4m4}$ are connected to the terminals of the signal read lines $S_1$, $S_2$, ... $S_{16m}$, respectively.

Here, as an example, the horizontal scanning line $l_1$ is commonly connected to the gate contacts of the switching transistors $M_{11}$–$M_{14}$. Each of the horizontal scanning lines $l_1$, $l_2$, ... $l_m$ has four switching transistors commonly connected thereto as a set through the gate contacts of the four switching transistors. First switching transistors of the respective sets of switching transistors (e.g., $M_{11}$, $M_{21}$, ...) are connected to a first output line 5; second switching transistors (e.g., $M_{12}$, $M_{22}$, ... ) are connected to a second output line 6; third switching transistors (e.g., $M_{13}$, $M_{23}$, ... ) are connected to a third output line 7; and fourth switching transistors (e.g., $M_{14}$, $M_{24}$, ... ) are connected to a fourth output line 8; thereby outputting pixel signals $S_1(\tau)$, $S_2(\tau)$, $S_3(\tau)$, and $S_4(\tau)$ from the output lines 5, 6, 7, and 8 in parallel.

FIG. 6 shows a typical connection between the horizontal scanning line $l_1$ and the first set of switching transistors $M_{11}-M_{14}$, and the horizontal scanning line $l_2$ and the second set of switching transistors $M_{21}-M_{24}$.

The signal read lines $S_1-S_8$ in the light receiving region is formed of a plurality of $n^+$-type impurity layers embedded in the p-type well layer, while the $n^+$-type impurity layers $S_1'-S_8'$ are embedded while separated at a predetermined interval from the terminals of the read line forming the $n^+$-type impurity layers. The N-channel MOS-type switching transistors $M_{11}-M_{14}$ are formed by laminating the horizontal scanning line $l_1$ (which is made of a polysilicon layer extending from the bit output contact $h_1$ of the horizontal scanning circuit 3) on an upper surface stretching between the $n^+$-type impurity layers $S_1-S_4$ and $S_1'-S_4'$. The N-channel MOS-type switching transistors $M_{21}-M_{24}$ are formed by laminating the horizontal scanning line $l_2$ (which is made of a polysilicon layer extending from the bit output $h_2$ of the horizontal scanning circuit 3) on the upper surface stretching between the $n^+$-type impurity layers $S_5-S_8$ and $S_5'-S_8'$.

The $n^+$-type impurity layers $S_1'$ and $S_5'$ are connected to the first output line 5 through contacts (designated by ⊠ in the figure); the $n^+$-type impurity layers $S_2'$ and $S_6'$ are connected to the second output line 6 through contacts; the $n^+$-type impurity layers $S_3'$ and $S_7'$ are connected to the third output line 7 through contacts; and the $n^+$-type impurity layers $S_4'$ and $S_8'$ are connected to the fourth output line 8 through contacts. The output lines 5, 6, 7 and 8 are made of an aluminum layer.

Referring to FIG. 7, the solid-state imaging device having such a construction can read four pixel signals transmitted simultaneously as a set from the group of photodiodes to each signal read line. The four pixel signals are read in synchronism with the vertical scan timing of each signal $S_{V1}$, $S_{V2}$, $S_{V3}$... applied from the vertical scanning circuit 2 at a horizontal scanning period of the horizontal scanning circuit 3. Therefore, even if the horizontal scanning circuit 3 is not operated at high speeds, a substantially rapid scanning operation can still be achieved. Thus, this solid-state imaging devices can accommodate a large number of pixels.

Accordingly, the solid-state imaging device which horizontally scans a plurality of pixel signals simultaneously, as shown in FIG. 5, can read the pixel signals equivalent to each frame at high speeds, so that a plurality of frames can be formed into an image at high speeds. As an example, this device can be used to take the instantaneous motion of a rapidly changing object as a plurality of frames.

However, research and development has revealed that this device has the following problem that must be overcome. Specifically, when a horizontal scanning signal is applied sequentially from each bit output $h_1$, $h_2$ ... $h_m$ of the horizontal scanning circuit 3 at a predetermined period $\tau$ during a horizontal scanning period so that four switching transistors grouped as a set corresponding to such bit output are caused to conduct and not to conduct sequentially for horizontal scanning, a voltage variation in the pixel signals of one set causes a voltage variation in the adjacent set due to inter-set capacitive coupling, thereby distorting the image.

This problem will be described in more detail with reference to FIG. 6. During a period in which the four pixel signals $S_1(\tau)$, $S_2(\tau)$, $S_3(\tau)$, and $S_4(\tau)$ are read in parallel by causing the first set of switching transistors $M_{11}-M_{14}$ to conduct by a scanning signal from the first bit output $h_1$ of the horizontal scanning circuit 3, the second set of switching transistors $M_{21}-M_{24}$ located adjacent thereto do not conduct. By causing the first set of switching transistors $M_{11}-M_{14}$ not to conduct and the second set of switching transistors $M_{21}-M_{24}$ to conduct, the four pixel signals $S_1(\tau)$, $S_2(\tau)$, $S_3(\tau)$, and $S_4(\tau)$ corresponding to the second set of switching transistors are read in parallel. In such a case, as the drain regions ($n^+$ impurity regions) $S_1'$, $S_2'$, $S_3'$, and $S_4'$ of the first set of switching transistors $M_{11}-M_{14}$ are electrically initialized, their depletion layer capacitances are varied, thereby affecting the drain regions ($n^+$ impurity regions) $S_5'$, $S_6'$, $S_7'$, and $S_8'$ of the second set of switching transistors $M_{21}-M_{24}$ which is adjacently located. Thus, this variation in the depletion layer capacitance acts as a voltage variation when the second set of pixel signals is read.

The same phenomenon is observed every time other sets of pixel signals are scanned at the predetermined period $\tau$, thereby contaminating the image with noise.

Particularly, the pixel signals $S_3(\tau)$ and $S_4(\tau)$ passing through the switching transistors $M_{14}$ and $M_{21}$ (FIG. 6), which are most closely adjacent to each other among two adjacent sets of switching transistors, are most strongly affected, and as a result, vertically striped video noise is present in the reproduced image.

Further, such vertically striped video noise tends to increase with increasing the number of output lines to obtain rapid horizontal scanning and increasing the number of switching transistors within a set resulting from such increase in output lines.

That is, if the number of switching transistors in each set is increased, so is the number of switching transistors conducting and not conducting simultaneously every period $\tau$, and as a result, the capacitive coupling between any two adjacent sets is likewise increased. Thus, the negative influence brought about on the image quality by the capacitive variation is aggravated.

SUMMARY OF THE INVENTION

The present invention has been made in view of such circumstances. Accordingly, an object of the present invention is to provide a MOS-type solid-state imaging device capable not only of eliminating the mutual influence between pixel signals during scanning, but also of achieving high speed scanning.

The invention is applied to a solid-state imaging device comprising: a plurality of photodiodes arrayed in matrix form in a light receiving region; a group of vertical scanning lines disposed in correspondence with each row of the photodiodes; a vertical scanning circuit for applying a vertical scanning signal to each vertical scanning line at a predetermined period; a group of signal read lines disposed in correspondence with each column of the photodiodes; a first group of switching transistors for transmitting pixel signals of the photodiodes to the group of signal read lines respectively by the vertical scanning signal; and a second group of switching transistors, disposed at a terminal of each signal read line, for transmitting pixel signals to an output line by causing the second group of switching transistors to sequentially conduct and not conduct in synchronism with a horizontal scanning signal applied from a horizontal scanning circuit at a predetermined period thereby to perform a horizontal scanning operation. Such a solid-state imaging device has a plurality of output lines, and each of the second group of switching transistors are connected to each of the plurality of output lines in correspondence with the order of arraying the output lines. In addition, the second group of switching transistors are divided into sets of plural switching transistors, which are made to correspond with the outputs of the horizontal scanning circuit in a one to one relationship, thereby causing the plural switching transistors within a set to be operated simultaneously by a horizontal scanning signal corresponding to that set so that a horizontal scanning operation is performed by the set of pixel signals.

Further, to achieve the object of the invention with the above solid-state imaging device, a separating layer formed of an impurity layer, which is held at a predetermined potential, is embedded at least between two adjacent switching transistors, each of which belonging to each of two adjacent sets of second switching transistors, thereby separating the capacitive coupling between the two adjacent sets of second switching transistors.

The separating layer may be provided every two adjacent second switching transistors irrespective of their being between two adjacent sets.

According to the solid-state imaging device of the present invention, a plurality of pixel signals are horizontally scanned simultaneously, thereby allowing a very high speed scanning operation. In addition, even if the pixel signals from a plurality of signal read lines are transmitted to a plurality of output lines simultaneously through the second group of switching transistors by causing these switching transistors to conduct and not to conduct in accordance with a scanning signal from the horizontal scanning circuit during horizontal scanning, the drain regions of these switching transistors are capacitively separated from each other at least by the predetermined set. This prevents variation between pixel signals, thus improving the image quality.

DESCRIPTION OF THE PREFERRED EMBODIMENTS

A solid-state imaging device, which is an embodiment of the invention, will now be described with reference to the accompany drawings.

Figure 5:
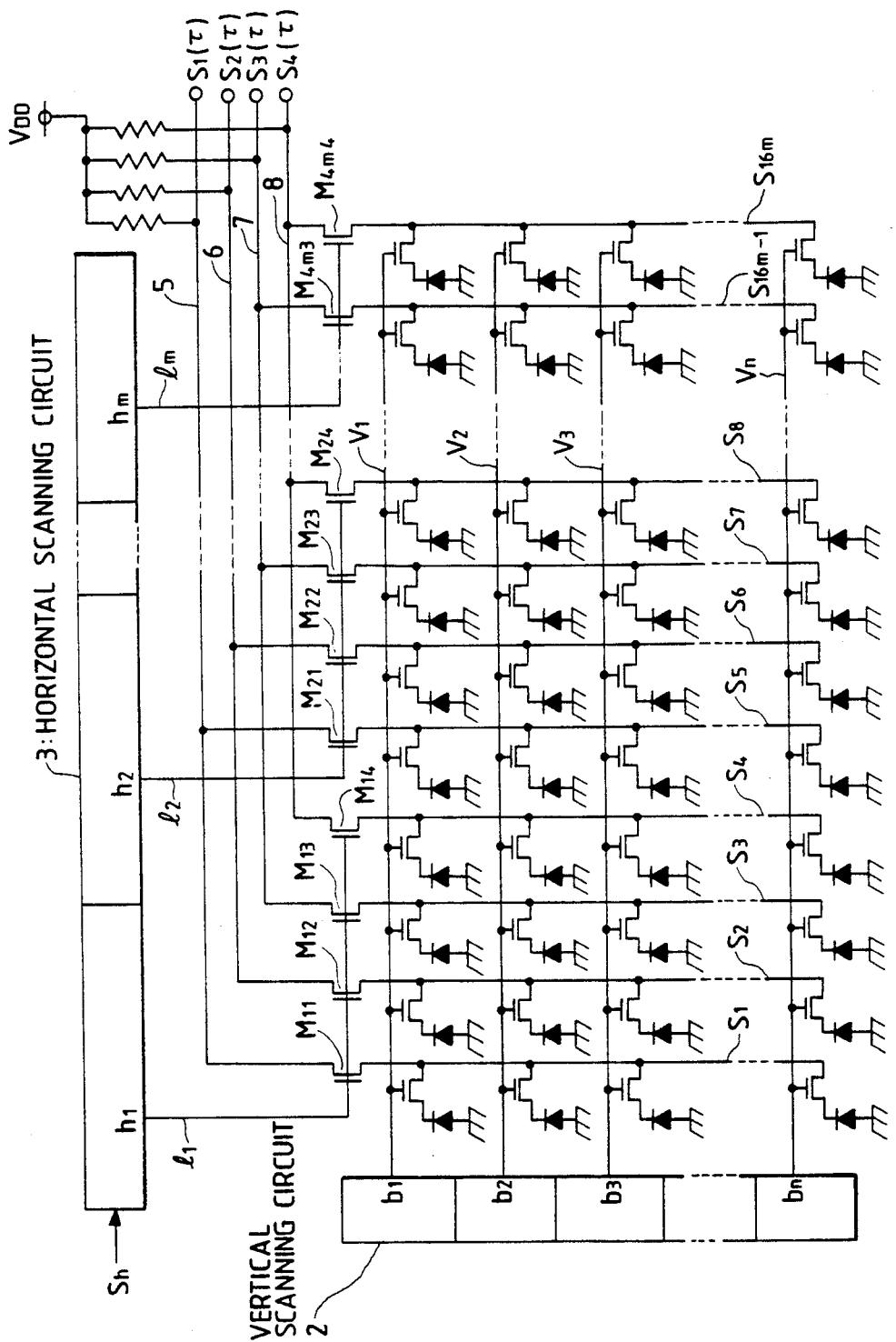
FIG. 5 is a diagram for explaining the construction of a second example of a conventional solid-state imaging device.
Figure 6:
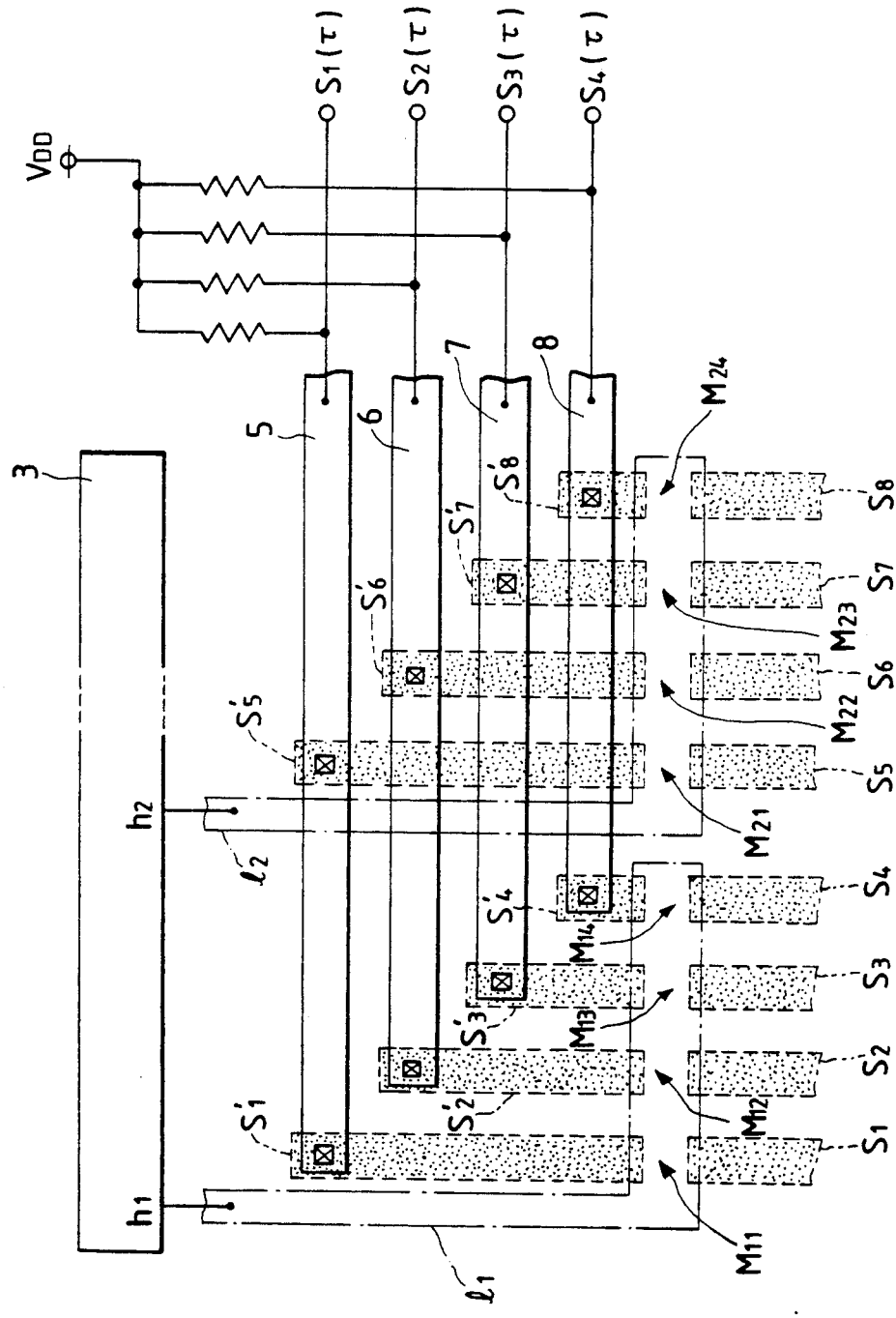
FIG. 6 is a partial plan view showing the structure of the main portion of the second convectional example.

This embodiment is a MOS-type solid-state imaging device having the same general structure as that shown in FIG. 5 and will be described with reference to FIGS. 1 and 2 in terms of differences from the conventional example.

Signal read lines $S_1$–$S_4$, $S_5$–$S_8$, $S_9$–$S_{12}$, ..., that are adjacent to an array of a group of photodiodes (equivalent to a group of pixels) in matrix form, are formed by embedding an $n^+$-type impurity layer in a p-type well layer of a semiconductor substrate. The $n+$ impurity layers $S_1'$–$S_4'$, $S_5'$–$S_8'$, $S_9'$–$S_{12}'$, ... are embedded while separated at a predetermined interval from the terminals of the signal read lines $S_1$–$S_4$, $S_5$–$S_8$, $S_9$–$S_{12}$, .... In the figures, only reference characters $S_1'$–$S_4'$, $S_5'$, $S_9'$ are described as representatives.

In addition, four N-channel MOS-type switching transistors $M_{11}$ to $M_{14}$ that operate simultaneously are formed by laminating a horizontal scanning line $l_1$, made of a polysilicon layer extending from a bit output $h_1$ of a horizontal scanning circuit 3, on the upper surface stretching between the $n^+$-type impurity layers $S_1$–$S_4$ and $S_1'$–$S_4'$. Four N-channel MOS-type switching transistors $M_{21}$ to $M_{24}$ that operate simultaneously are formed by laminating a horizontal scanning line $l_2$, made of the polysilicon layer extending from a bit output $h_2$ of the horizontal scanning circuit 3, on the upper surface stretching between the $n^+$-type impurity layers $S_5$–$S_8$ and $S_5'$–$S_8'$. Four N-channel MOS-type switching transistors $M_{31}$ to $M_{34}$ that operate simultaneously are formed by laminating a horizontal scanning line $l_3$, made of the polysilicon layer extending from a bit output $h_3$ of the horizontal scanning circuit 3, on the upper surface stretching between the $n^+$-type impurity layers $S_9$–$S_{12}$ and $S_9'$–$S_{12}'$. Although not shown in the figures, other switching transistors for horizontal scanning are similarly constructed.

Further, the $n^+$-type impurity layers $S_1'$, $S_5'$, and $S_9'$ and other similarly arrayed $n^+$-type impurity layers (not shown) are commonly connected to a first output line 5 formed of an aluminum layer through contacts (designated by ⊠); the $n^+$-type impurity layers $S_2'$, $S_6'$, and $S_{10}'$ and other similarly arrayed $n^+$-type impurity layers (not shown) are commonly connected to a second output line 6 formed of the aluminum layer through contacts (designated by ⊠); the $n^+$-type impurity layers $S_3'$, $S_7'$, and $S_8'$ and other similarly arrayed $n^+$-type impurity layers (not shown) are commonly connected to a third output line 7 formed of the aluminum layer through contacts (designated by ⊠ ); and the $n^+$-type impurity layers $S_4'$, $S_8'$, and $S_{12}'$ and other similarly arrayed $n^+$-type impurity layers (not shown) are commonly connected to a fourth output line 8 formed of the aluminum layer through contacts (designated by ⊠ ). A portion sharing the signal read lines $S_1$–$S_4$, $S_5$–$S_8$, $S_9$–$S_{12}$, ... in common correspond to the source contact regions of the switching transistors $M_{11}$–$M_{14}$, $M_{21}$–$M_{24}$, $M_{31}$–$M_{34}$, ..., while the regions $S_1'$–$S_4'$, $S_5'$–$S_8'$, $S_9'$–$S_{12}'$, ... correspond to the drain contact regions.

In addition, separating layers 9 (a shaded portion in the figures), formed of an $n^+$-type impurity substance, which are embedded between the regions $S_1'$–$S_4'$, $S_5'$–$S_8'$, $S_9$––$S_{12}'$, ... have a predetermined voltage $V_1$ applied thereto.

Figure 1:
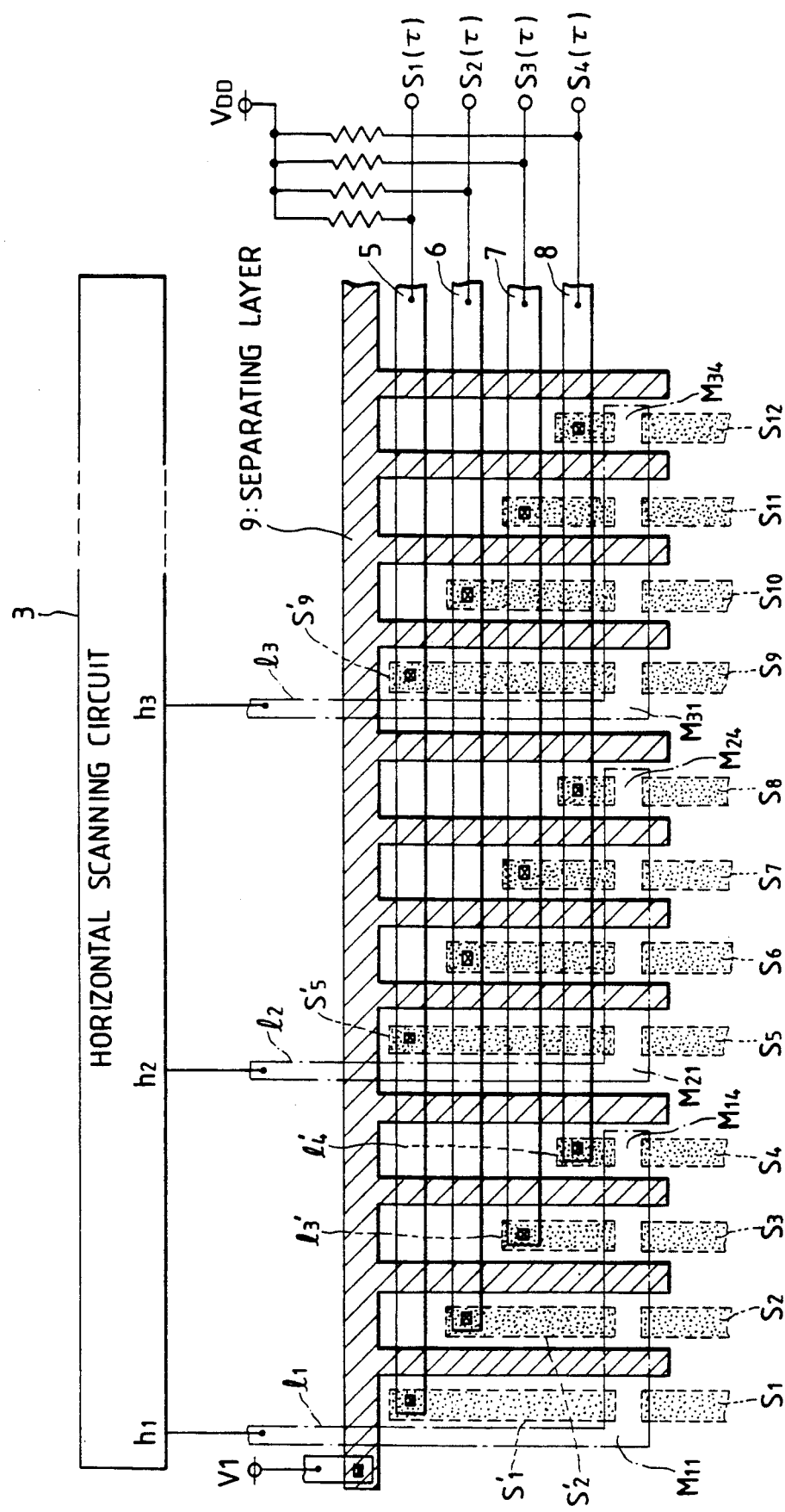
FIG. 1 is a partial plan view showing the structure of the main portion of a solid-state imaging device, which is an embodiment of the invention.
Figure 2:
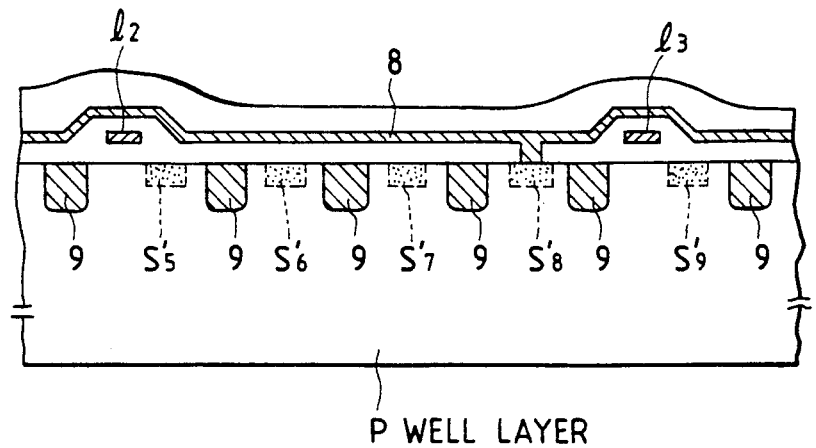
FIG. 2 is a partial longitudinal sectional view showing the structure of a specific portion shown in FIG. 1.
Figure 3:
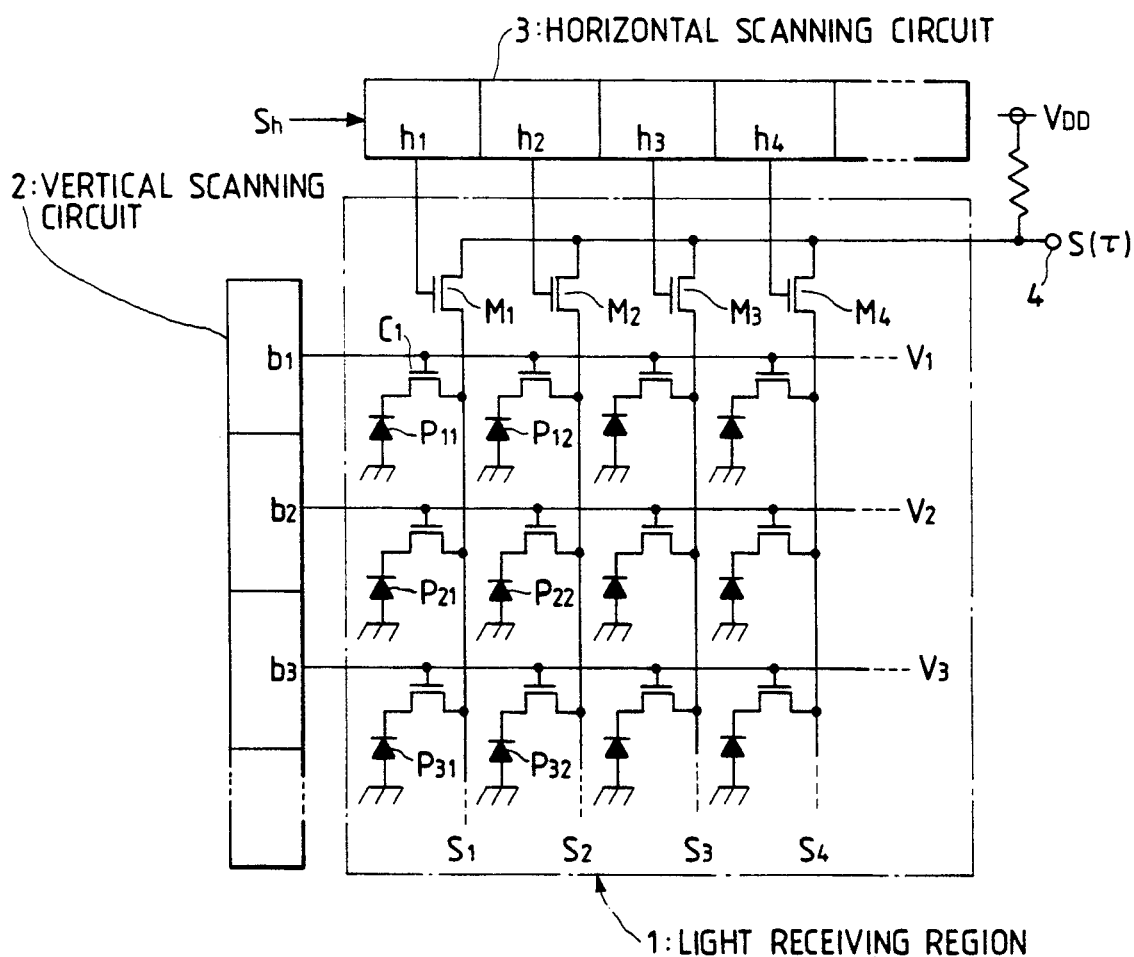
FIG. 3 is a diagram for explaining the construction of a first example of a conventional solid-state imaging device.
Figure 4:
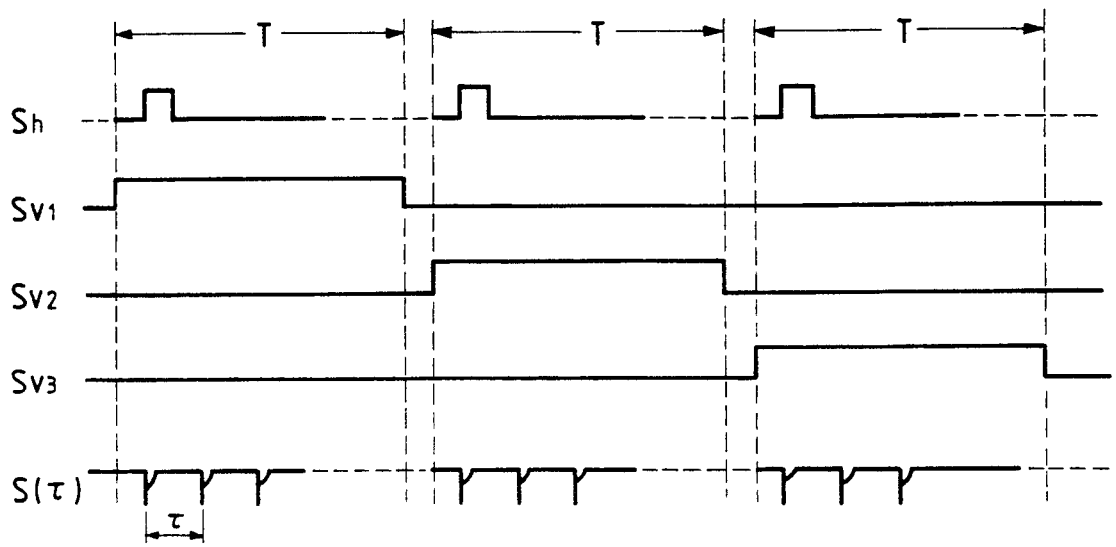
FIG. 4 is a timing chart showing the operation of the first conventional example.

Therefore, the drain region and separating layer 9 of the switching transistor are constructed as shown in FIG. 2 (the longitudinal sectional structure in the vicinity of the switching transistors $M_{21}$–$M_{31}$ shown in FIG. 1 is shown along the length of the output line 8).

The voltage $V_1$ is set to be greater than or equal to zero i.e., $V_1 \geqq 0$), and it is necessary to keep the voltage fixed so that the potential at the separating layers 9 will not vary. If the voltage $V_1$ is equal to or greater than a supply voltage $V_{DD}$ for the solid-state imaging device (i.e., $V_1 \geqq V_{DD}$), smear can be reduced, which is an advantage.

With reference to the depths of the impurity layer (e.g., $S_5'-S_8'$, $S_9'$ in FIG. 2) constituting part of the switching transistor and the separating layer 9, a deeper separating layer 9 brings about a better effect, as shown in FIG. 2. However, the invention is not particularly limited thereto, and thus the object of the invention may be achieved by making the separating layer 9 shallower than the impurity layer.

Figure 7:
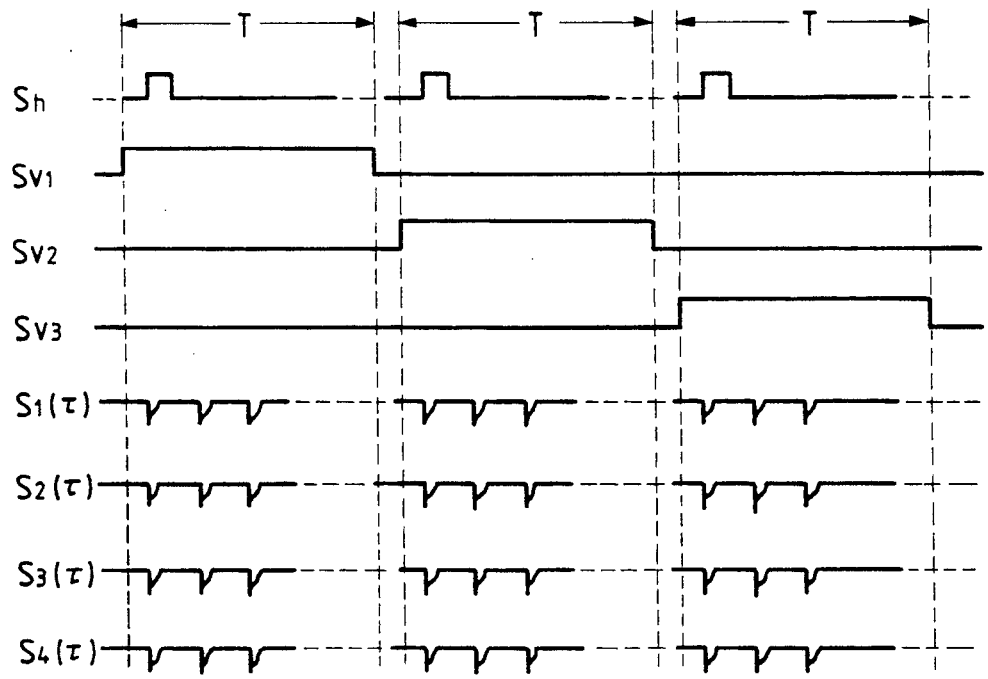
FIG. 7 is a timing chart showing the operation of the second conventional example.

When an image is horizontally scanned by the horizontal scanning circuit 3, a set of four switching transistors are sequentially put in conduction in synchronism with a horizontal scanning signal sequentially outputted from each bit output $h_1$, $h_2$, or $h_3$, . . . . Thus, the pixel signals $S_1(\tau)$, $S_2(\tau)$, $S_3(\tau)$, and $S_4(\tau)$ for four pixels are read simultaneously so that a process similar to that shown in the timing chart of FIG. 7 will be performed.

Consequently, according to this embodiment, a plurality of pixel signals can be read simultaneously and globally by horizontal scanning, thereby allowing high speed signal reading.

In addition, the separating layers 9 are formed between the drain regions within the group of switching transistors for horizontal scanning reading (the second group of switching transistors), thereby separating the capacitive coupling between the drain regions of the two adjacent switching transistors. As a result, even if the capacitance of the depletion layer in the drain region is varied due to the operation of a switching transistor, the drain region of a switching transistor adjacent thereto will not be affected.

Therefore, no pixel signal variations can be caused during horizontal scanning as in the past, thus improving the video quality.

While four switching transistors are operated as a set with respect to each bit output $h_1$, $h_2$, $h_3$, . . . of the horizontal scanning circuit 3 in this embodiment, the number of switching transistors within a set is not limited thereto but may be determined arbitrarily.

While the separating layer 9 is formed between the drain regions of all the switching transistors for horizontal scanning in this embodiment, the separating layer may also be formed at least between the drain regions of the two adjacent switching transistors, each belonging to each of the two adjacent sets thereof. Such an arrangement of separating layers is still effective in reducing the negative influence caused between the pixel signals read globally by the set.

As described above, according to the invention, a plurality of pixel signals are horizontally scanned simultaneously, thereby allowing a very high speed scanning operation to be performed. Further, even if a plurality of pixel signals are simultaneously transmitted from a plurality of signal read lines to a plurality of output lines through a second group of switching transistors by turning them on and off in accordance with a scanning signal from the horizontal scanning circuit during horizontal scanning, the drain regions can be capacitively separated from each other at least by the predetermined set of switching transistors. Therefore, the pixel signals are not varied from each other and thus the video quality can be improved.

Moreover, the device of the invention can image, in particular, a plurality of frames rapidly and clearly within a short period of time, and this provides an advantage in the field of high speed imaging, e.g., taking the instantaneous motion of a rapidly changing object as a still image consisting of a plurality of frames.

What is claimed is:

1. A solid-state imaging device comprising: a light receiving region; a plurality of photodiodes arranged in rows and columns in a matrix form in said light receiving region; a group of vertical scanning lines disposed in correspondence with each row of said photodiodes; a vertical scanning circuit for applying a vertical scanning signal to each vertical scanning line at a first predetermined period; a horizontal scanning circuit for applying a horizontal scanning signal at a second predetermined period; a group of signal read lines disposed in correspondence with each column of said photodiodes; a terminal connected to each of said signal read lines; a first group of switching transistors for transmitting pixel signals of said photodiodes to said group of signal read lines respectively by said vertical scanning signal; and a second group of switching transistors, disposed at said terminal of each signal read line, for transmitting pixel signals to an output line by causing said second group of switching transistors to sequentially conduct and not conduct in synchronism with said horizontal scanning signal to perform a horizontal scanning operation, said output line being arranged in a plurality, each of said second group of switching transistors being connected to each of said plurality of output lines, said second group of switching transistors being divided into sets of plural switching transistors, said sets corresponding to outputs of said horizontal scanning circuit in a one-to-one relationship, causing said plural switching transistors within a set to be operated simultaneously by a horizontal scanning signal corresponding to a set so that said horizontal scanning operation is performed by said set of pixel signals; and a separating layer formed of an impurity layer, said separating layer being held at a predetermined potential and being embedded at least between two adjacent sets of said switching transistors.

2. The solid-state imaging device according to claim 1, wherein said second group of switching transistors are each formed by laminating said corresponding output of said horizontal scanning circuit on an upper surface extending between two adjacent impurity layers.

3. The solid-state imaging device according to claim 1, wherein said impurity layer is formed of an $n^+$-type material in a p-type well of a semiconductor substrate.

4. The solid-state imaging device according to claim 1, wherein said horizontal scanning line is formed of a polysilicon layer extending from a bit output of said horizontal scanning circuit on the upper surface extending between the impurity layers.

5. The solid-state imaging device according to claim 1, wherein said output lines are formed of an aluminum layer.

6. The solid-state imaging device according to claim 1, said predetermined potential is a constant value greater than zero.

7. The solid-state imaging device according to claim 1, wherein said second switching transistor further comprises a drain region, said drain region being embedded while separated at a predetermined interval from the terminals of said signal read lines.

8. The solid-state imaging device according to claim 1, wherein said second group of switching transistor is of an N-channel MOS-type.

9. The solid-state imaging device according to claim 1, wherein said set of switching transistors consists of four switching transistors.

10. A solid-state imaging device for performing a horizontal scanning operation, comprising: a horizontal scanning circuit for generating a plurality of horizontal scanning signals at a first predetermined period; a group of signal read lines; a group of output lines; light receiving means for converting light into a plurality of pixel signals; a vertical scanning circuit for generating a plurality of vertical scanning signals at a second predetermined period; first switching means responsive to said vertical scanning signals for transmitting said pixel signals to said group of signal read lines; and second switching means for sequentially transmitting said pixel signal from said group of signal read lines to said group of output lines in synchronism with said horizontal scanning signals.

11. A solid-state imaging device comprising: a plurality of photodiodes arranged in an array of rows and columns for generating pixel signals; a group of vertical scanning lines arranged in rows in a one-to-one relationship with said rows of said photodiodes; a vertical scanning circuit for sequentially applying a predetermined voltage to said vertical scanning lines at a first predetermined period; a group of signal read lines arranged in columns in a one-to-one relationship with said columns of said photodiodes; a horizontal scanning circuit for sequentially applying a predetermined voltage to said signal read lines at a second predetermined period; a first plurality of switching transistors arranged in columns and rows in a one-to-one relationship with said photodiodes, each row of switching transistors being turned on or off in accordance with the voltage level of a corresponding one of said vertical scanning lines; a second plurality of switching transistors arranged in a single row and divided into a plurality of sets, each of said second plurality of switching transistors corresponding to a different column of said photodiodes, the transistors of each of said sets being simultaneously turned on or off in accordance with the voltage level of a corresponding one of said signal read lines; and a set of output lines, each of said output lines being connected to a respective one of said transistors within each of said sets of said second plurality of switching transistors; wherein simultaneously turning on one of said rows of said first plurality of switching transistors and one set of said second plurality of switching transistors causes a set of pixel signals equal in number to the number of said output lines to be outputted to said output lines.

* * * * *